United States Patent
Tang et al.

[19]

[11] Patent Number: 6,149,776

[45] Date of Patent: Nov. 21, 2000

[54] COPPER SPUTTERING TARGET

[75] Inventors: Howard Tang; Imran Hashim; Richard Hong; Peijun Ding, all of San Jose, Calif.

[73] Assignee: Applied Materials, Inc., Santa Clara, Calif.

[21] Appl. No.: 09/191,253

[22] Filed: Nov. 12, 1998

[51] Int. Cl.[7] .................................................. C23C 14/34
[52] U.S. Cl. ............................... 204/192.12; 204/298.11; 204/298.12
[58] Field of Search ........................ 204/192.12, 298.11, 204/298.12

[56] References Cited

U.S. PATENT DOCUMENTS

| | | | |
|---|---|---|---|
| 5,316,802 | 5/1994 | Ebe et al. | 427/533 |
| 5,403,779 | 4/1995 | Joshi et al. | 437/190 |
| 5,538,603 | 7/1996 | Guo | 204/192.12 |
| 5,658,442 | 8/1997 | Van Gogh et al. | 204/298.12 |
| 5,935,397 | 8/1999 | Masterson | 204/298.12 |

OTHER PUBLICATIONS

DD 279369 abstract, May 1990.

*Primary Examiner*—Nam Nguyen
*Assistant Examiner*—Steven H. Ver Steeg
*Attorney, Agent, or Firm*—Thomason, Moser & Patterson

[57] ABSTRACT

The present invention generally provides an apparatus and a method for physical vapor deposition of a metal onto a substrate comprising a physical vapor deposition chamber and a target disposed in an upper portion of the chamber. The target comprises a backing plate having a central portion and a flange portion attachable to the physical vapor deposition chamber, a sputterable portion extending from the central portion of the backing plate, and an annular ridge disposed on a surface of the flange portion. Preferably, the sputterable portion of the target includes a restriction side wall that restricts entry of plasma and back-scattered particles into the dark space gap between an upper shield and the target.

34 Claims, 3 Drawing Sheets

COPPER SPUTTERING TARGET

BACKGROUND OF THE INVENTION

1. Field of the Invention

The present invention generally relates to physical vapor deposition. More particularly, the invention relates to a copper sputtering target for use in a physical vapor deposition chamber and process.

2. Background of the Related Art

As circuit densities increase for the next generation of ultra large scale integration, copper is becoming a choice metal for filling nanometer-sized, high aspect ratio interconnect features on substrates because copper and its alloys have lower resistivities than aluminum and significantly higher electromigration resistance as compared to aluminum. These characteristics are important for supporting the higher current densities experienced at high levels of integration and increased device speed. Copper also provides good thermal conductivity and is readily available in a highly pure state.

FIG. 1 is a simplified cross sectional view of a typical physical vapor deposition chamber 100 useful for deposition of copper. The PVD chamber 100 generally includes a housing 101, a substrate support assembly 102, a cover ring 104, a plasma shield 106, a dark space shield 108 and a target 112. As shown, the PVD chamber 100 may also include a collimator 110 to enhance deposition into apertures on the surface of the substrate. During processing, a substrate 122 is positioned on the substrate support assembly 102, and a processing gas, such as argon, is introduced into a region 120 defined by the target 112, the dark space shield 108 and the collimator 110. A plasma of the processing gas is struck in the region 120 by applying a bias (RF or DC) between the target 112 and the substrate support assembly 102. Ions from the plasma are attracted to and collide with the target to cause sputtering of the deposition material from the target 112 onto the substrate 122.

FIG. 2 is a cross sectional detail of a dark space shield 108 and a target 112 of FIG. 1. The target 112 generally comprises a backing plate 114 typically made of aluminum and a sputterable layer 116 made of a sputterable deposition material such as copper. The backing plate 114 includes a target support flange 124 that rests on (or is otherwise secured on) an insulator ring 126 disposed at a top portion of the housing 101. The insulator ring 126 provides electrical insulation between the target 112, which is typically biased at a particular voltage, from the housing 101, which is typically grounded. An O-ring 128 disposed in an annular recess 130 on a lower surface of the target support flange 124 provides a seal between the target support flange 124 and the insulator ring 126 to enable a vacuum environment to be maintained in the chamber 100. Typically, a small gap 132 is formed between the lower surface 138 of the target support flange 124 and an upper surface 140 of the insulator ring 126.

The dark space shield 108 is secured on the housing 101 and supports the collimator 110 at a lower end of the dark space shield 108 (as shown in FIG. 1). An upper end of the dark space shield 108 is disposed between the insulator ring 126 and the sputterable layer 116 of the target 112. A dark space gap 134 is formed between an upper surface 136 of the dark space shield 108 and the lower surface 138 of the target support flange 124, and an entry gap 142 is formed between an annular curved edge 144 of the sputterable layer 116 and an inner surface 146 of the dark space shield 108. The annular curved edge 144 of the sputterable layer 116 creates an overhang portion 148 that narrows the entry gap 142. The backing plate 114 includes a recessed corner portion 150.

Although a variety of advanced PVD techniques, including long throw, collimation and ionized metal plasma, have been successfully demonstrated for copper deposition by PVD (PVD Cu), a number of obstacles are presented for PVD Cu because of the properties and characteristics of copper such as a higher melting point, a lower sticking coefficient, relative inertness and higher sputtering yields as compared to other metals, such as aluminum and titanium. PVD Cu generally deposits in an over-cosine deposition pattern with less directionality in which the sputtered Cu atoms mostly do not follow a line of sight deposition and may bounce off a number of surfaces before becoming bonded to a final surface. Additionally, sputtered Cu atoms form relatively weak bonds on most surfaces and can be detached by other impinging energetic Ar/Cu ions or atoms. Currently, one of the preferred PVD Cu techniques is a Low-Pressure Long-Throw (LPLT) process wherein the pressure of the chamber during processing is maintained between about 0.2 mTorr and about 1.0 mTorr and the spacing between the target and the substrate is typically between about 100 mm and about 300 mm. The properties and characteristics of copper and PVD Cu present a number of problems in the LPLT PVD Cu chamber that were not encountered in other PVD Cu techniques and deposition of other metals.

First, plasma is not restricted by the overhanging portion 148 from entering through the entry gap 142 and reaching surfaces above the overhanging portion 148 because the sputterable layer 116 is not thick enough to create an entry gap 142 that is long enough to prevent entry of the plasma. Plasma that reaches the surfaces beyond the overhanging portion 148 causes sputtering of the target material, including both the sputterable material and the backing plate material, from the surfaces between the overhanging portion 148 and the recessed corner portion 150. Furthermore, this problem is exacerbated in a low pressure environment because copper can self-sustain plasma in a sub-mTorr environment after plasma ignition due to the lower requirement of an electron escaping energy from the target.

As shown in FIG. 2, the sputtered material from the surfaces above the overhanging portion 148 has a direct line of entry into the dark space gap 134. Material sputtered from the overhanging portion 148 can directly enter the dark space gap 134. The sputtered particles that enter the dark space gap 134 can reach the small gap 132 and deposit onto the surfaces in the small gap 132 and the O-ring 128. The sputtered particles that enter the dark space gap 134 can also deposit onto the exposed surfaces of the insulator ring 126. The unwanted deposition on the O-ring 128 and the insulator ring 126 becomes a particle source that may generate particles that contaminate subsequently processed substrates. The unwanted deposition on the O-ring 128 and the insulator ring 126 also causes cross-contamination problems with other non-copper components. The deposition on the O-ring 128 and the insulator ring 126 may also cause an electrical short or arcing between the target 112 and the dark space shield 108 that may damage both the target 112 and the dark space shield 108.

Secondly, in a low pressure environment, the sputtered copper atoms have a mean free path that allows the copper atoms to deposit onto surfaces that were previously unreachable in higher pressure PVD Cu processes. Because of a decrease in the number of argon atoms in the low pressure plasma environment, the sputtered copper atoms travel longer distances before colliding with argon atoms.

Additionally, the sputtered copper particles tend to bounce off a number of surfaces before sticking to a final surface because the sputtered copper has a low sticking coefficient. The combination of a long mean free path and a low sticking coefficient allows the sputtered copper particles to deposit onto surfaces that were previously unreachable and uncontaminated in other PVD Cu processes, such as the surfaces within the gap 132 and the O-ring 128. As discussed above, the deposition onto these surfaces may cause damage to the target 112, the dark space shield 108 and/or other subsequently processed substrates.

Another factor that contributes to deposition onto these surfaces that were previously uncontaminated is that the LPLT sputtering technique requires a longer process time because LPLT sputtering of copper has a lower deposition efficiency as compared to other PVD Cu techniques. The longer processing time leads to an increased temperature during processing that increases the mobility of the copper atoms and contributes to deposition of copper onto surfaces that were previously inaccessible to the sputtered copper atoms.

The deposition on the surfaces within the gap 132, the O-ring 128 and the insulator ring 126 becomes a particle source that may generate particles that contaminate subsequently processed substrates. Particularly with copper deposition, the copper contaminant particles may cause cross contamination problems with aluminum based front end devices. Also, the deposition on the O-ring 128 and the insulator ring 126 may cause an electrical short or arcing between the target 112 and the dark space shield 108, which may result in improper processing and defect formation on the substrate. Since the O-ring 128 and the insulator ring 126 are typically part of a processing kit that is replaced periodically, the deposition of copper onto these surfaces requires more frequent replacements of the process kit and reduces throughput because of the excess time spent removing and reattaching the process kit.

Therefore, there remains a need for a target for a PVD chamber for deposition of copper that significantly reduces deposition on the surfaces within the target dark space and the insulator ring and prevents deposition on the O-ring to reduce contaminant particle generation and to prolong the useful lifetime of the process kit.

SUMMARY OF THE INVENTION

The present invention generally provides a target for a PVD chamber for deposition of copper that significantly reduces deposition on the surfaces within the target dark space and the insulator ring and deposition on the O-ring to reduce contaminant particle generation and prolong the useful lifetime of the process kit. In a preferred embodiment, the target comprises a backing plate having a central portion and a flange portion attachable to the physical vapor deposition chamber, a sputterable portion extending from the central portion of the backing plate, and an annular ridge disposed on a surface of the flange portion. Preferably, the sputterable portion of the target includes a restriction side wall that restricts entry of plasma and back-scattered particles into the dark space between an upper shield and the target. Preferably, the restriction side wall comprises an annular curved side wall that tapers radially inwardly to an annular recess in the backing plate. The annular recess is shadowed by the annular curved side wall from receiving deposition of back scattered particles.

Another aspect of the invention provides an apparatus for physical vapor deposition of a metal onto a substrate comprising a physical vapor deposition chamber and a target disposed in an upper portion of the chamber. The target comprises a backing plate having a central portion and a flange portion attachable to the physical vapor deposition chamber, a sputterable portion extending from the central portion of the backing plate, and an annular ridge disposed on a surface of the flange portion. Preferably, the chamber is used for low-pressure, long-throw physical vapor deposition of a metal such as copper. The invention may also be practiced with a solid target, i.e., no backing plate, wherein the features of the combined sputtering surface and backing plate are incorporated therein.

Yet another aspect of the invention provides a method for depositing a metal onto a substrate, comprising: providing a physical vapor deposition chamber having a target; surrounding a sputterable portion of the target with an annular shield; shielding a gap between a flange portion of the target and a surface of the chamber using an annular ridge disposed on a surface of the flange portion; positioning the substrate within the chamber; and sputtering metal from the sputterable portion of the target.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
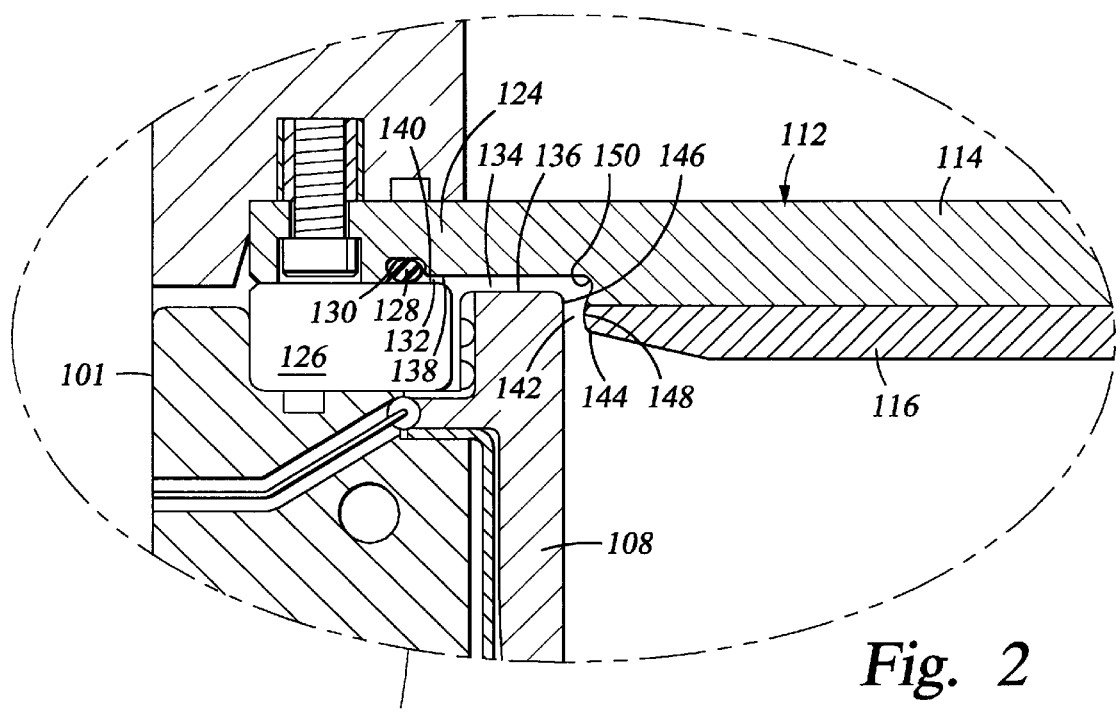
FIG. 2 is a cross sectional detail of a dark space shield 108 and a target 112 of FIG. 1.
Figure 1:
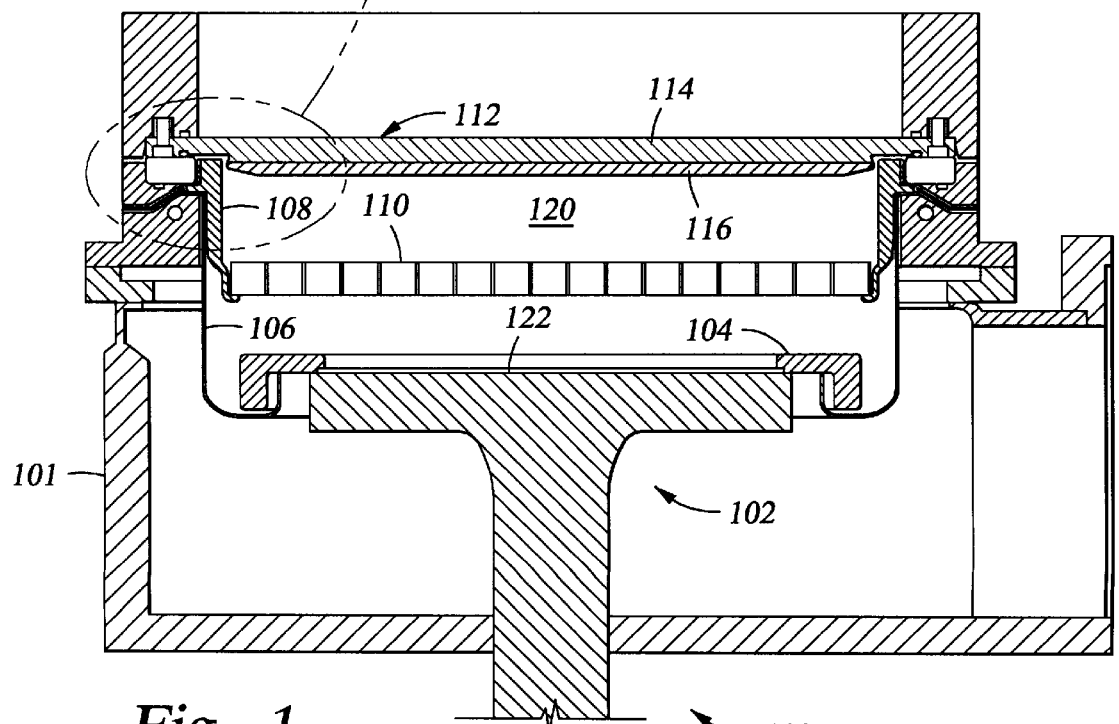
FIG. 1 is a simplified cross sectional view of a typical physical vapor deposition chamber 100 useful for deposition of copper, labeled "Prior Art."
Figure 3:
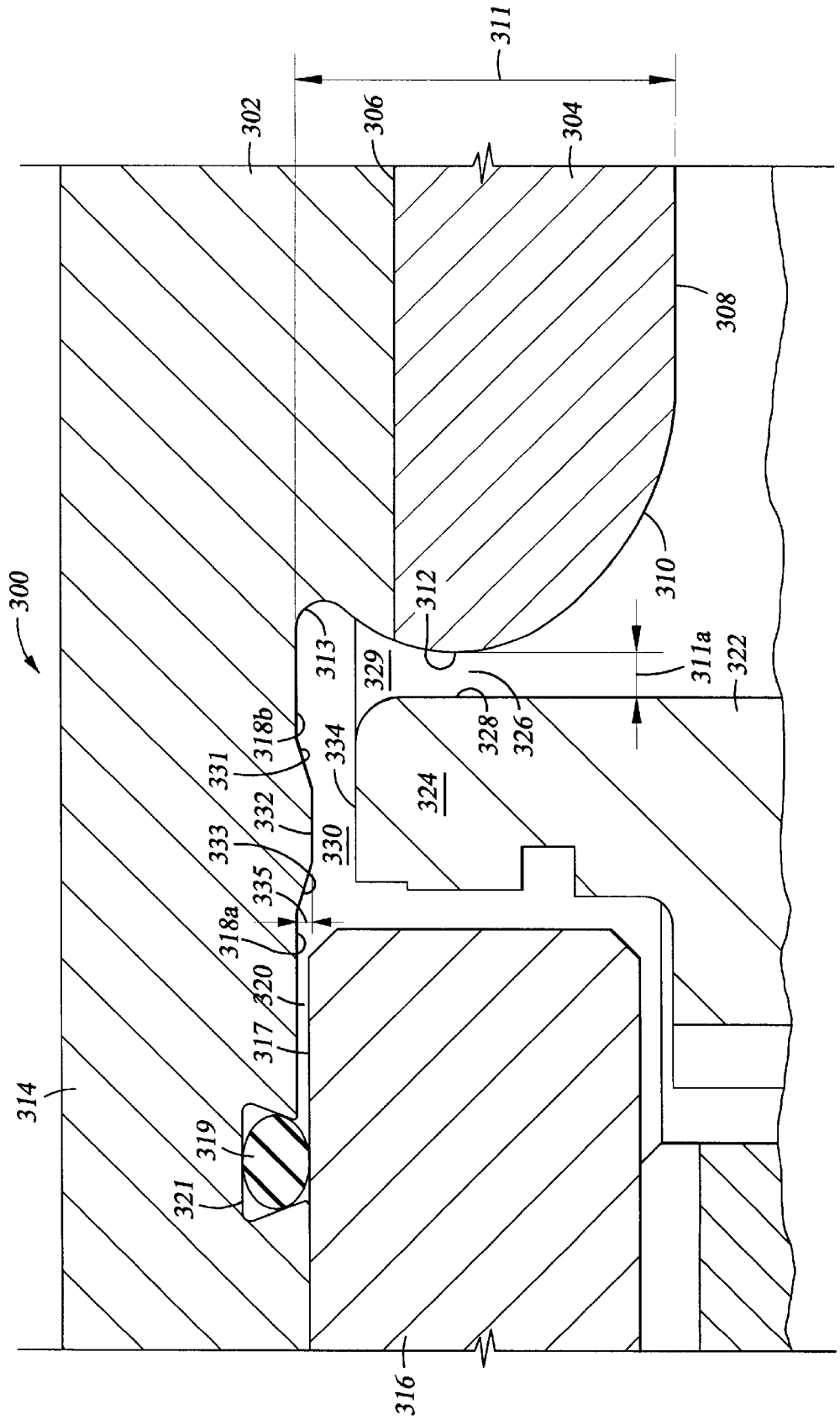
FIG. 3 is a partial cross sectional view of a target 300 according to the invention disposed on a chamber housing.

FIG. 3 is a partial cross sectional view of a target 300 according to the invention disposed on a chamber housing. The target 300 generally comprises a backing plate 302 and a sputterable portion 304. The target 300 is typically disposed in an upper portion of a PVD chamber on an insulator ring 316 of the chamber housing. The target 300 of the present invention is retrofittable onto existing physical processing chambers, such as the PVD chamber shown in FIG. 1.

The sputterable portion 304 of the target 300 comprises a material to be deposited onto a substrate processed in the PVD chamber. The sputterable portion 304 is preferably diffusion bonded or otherwise firmly affixed onto the backing plate 302 at an interface 306. Alternatively, both the backing plate 302 and the sputterable portion 304 can be made of the same sputterable material in a one-piece construction. The sputterable portion 304 includes a central sputtering surface 308 and a tapered annular edge 310 surrounding the central sputtering surface 308. Preferably, the central sputtering surface 308 is substantially flat and is disposed in the chamber substantially parallel to a substrate support member's substrate supporting surface. The tapered annular edge 310 provides a smooth transition from the flat central sputtering surface 308 to a side surface of the sputterable portion 304 and promotes deposition uniformity by reducing abrupt changes in the sputtering surface. As shown in FIG. 3, the tapered annular edge 310 curves into an annular curved side wall 312 that extends around the sputterable portion 304. Preferably, the annular curved side wall 312 has a substantially convex profile and tapers radially inwardly as it approaches the interface 306 between the sputterable portion 304 and the backing plate 302. The tapering continues into the backing plate 302 and forms an annular recess 313. The annular recess 313 is shadowed by the annular curved side wall 312 from deposition due to back-scattered atoms. The annular side wall 312 serves as a restriction side wall that restricts entry of plasma and back-scattered particles into a dark space between an upper shield and the target. By reducing the deposition onto the surfaces near the annular recess 313, which is also called the maximum stress corner, the invention significantly reduces generation of contaminant particles during processing that may cause defect formations on the processed substrates.

The backing plate 302 typically comprises a metal different from the deposition material, such as aluminum in the case of copper deposition. The backing plate 302 includes a target support flange portion 314 that rests on or is otherwise secured to an insulator ring 316 disposed on a top portion of the chamber housing. The insulator ring 316 electrically insulates the target (biased) from the chamber housing (typically grounded). An O-ring 319 disposed in an annular recess 321 provides a seal between the target support flange portion 314 and the insulator ring 316. A gap 320 is formed between an upper surface 317 of the insulator ring 316 and an outer bottom surface 318a of the target support flange portion 314. The gap 320 extends radially inwardly of the O-ring 319 and typically has a height of about 10 mils at atmospheric pressure which becomes less than 10 mils when the chamber is under a vacuum pressure.

An annular ridge 332 is disposed between the outer bottom surface 318a and an inner bottom surface 318b of the target support flange portion 314, extending in the same direction from the backing plate 302 as the sputterable portion 304. The annular ridge 332 in combination with the upper surface 317 forms an annular restriction which prevents or significantly reduces direct entry of back-scattered atoms from bouncing into the gap 320 and elongates the path to the entry of the gap 320 by forcing back-scattered atoms, particularly those traveling in a horizontal direction, to bounce off a number of surfaces before reaching the entry of the gap 320. Preferably, the annular ridge 332 includes at least one sloped or tapered side surface 331, 333 to direct the back-scattered atoms to bounce away from the gap 320. A ridge height 335 is defined as the height of the annular ridge 332 extending from the outer bottom surface 318a. The annular ridge 332 has a ridge height 335 greater than the height of the gap 320 to prevent direct entry of back scattered atoms into the gap 320. Preferably, the annular ridge 332 has a ridge height 335 that is at least about twice the height of the gap 320.

An upper shield 322 is disposed in an upper portion of the chamber. An upper end 324 of the upper shield 322 extends into the region between the insulator ring 316 and the sputterable portion 304. A re-entry gap 326 is formed between the side wall 312 of the sputterable portion 304 and a vertical inner surface 328 of the upper shield 322. A first dark space gap 329 is formed between the re-entry gap 326 and the inner bottom surface 318b, including the region adjacent the annular recess 313. Preferably, the distance 311 between the central sputtering surface 308 and the inner bottom surface 318b is at least about five times, preferably about nine times, the width 311a of the re-entry gap 326 to provide a re-entry gap that is sufficiently long and narrow to restrict entry of plasma and back-scattered particles into the first dark space gap 329. A second dark space gap 330 is formed between an upper surface 334 of the upper shield 322 and the target support flange portion 314. As shown in FIG. 3, the second dark space gap 330 is defined as the region above the dark space shield upper surface 334 and below the backing plate outer and inner bottom surfaces 318a and 318b of the annular ridge 332 and the tapered side surfaces 331 and 333 of the backing plate. The second dark space gap 330 extends substantially perpendicularly from the first dark space gap 329.

First and second dark space shield gaps 329, 330 form elongated thin regions where sputter gas migration is limited and plasma formation is restricted, intermittent, or eliminated. During the physical vapor deposition process, the curved side wall 312 adjacent the vertical inner surface 328 of the upper shield 322 restrains entry of the plasma through the re-entry gap 326 and prevents or significantly reduces sputtering from the portion of the sputterable portion 304 that is exposed to the first dark space gap 329. By preventing sputtering from this portion of the sputterable portion 304, the curved side wall 312 restricts direct entry of sputtered atoms through the dark space gap 330 into the gap 320 between the outer bottom surface 318a of the flange portion 314 of the backing plate 302 and the upper surface 317 of the insulator ring 316. Because the annular recess 313 is shadowed by the annular curved side wall 312, the surfaces near the annular recess 313 receive very little or no deposition from back scattered particles. The curved side wall and the adjacent vertical inner surface 328 of the upper shield 322 also limit the entry of back-scattered atoms through the re-entry gap 326 to nearly perpendicular angles to the inner bottom surface 318b of the flange portion 314 of the backing plate 302. Because the back-scattered atoms impinge onto the inner bottom surface 318b at nearly perpendicular angles, the back-scattered atoms are more likely to stick and remain deposited on the inner bottom surface 318b. Even if the back-scattered atoms do not stick to the inner bottom surface 318b on their first impact and bounce off the inner bottom surface 318b of the flange portion 314, the back-sputtered atoms will likely deposit onto an inner end of the upper surface 334 of the upper shield 322 or deposit onto the annular ridge 332.

The annular ridge 332 direct entry of back-scattered atoms from bouncing into the gap 320. The annular ridge 332 also elongates the path to the entry of the gap 320 by forcing back-scattered atoms to bounce off a number of surfaces before reaching the region near the entry of the gap 320, and by decreasing the bounce space and thus increasing the number of impending collisions per unit of length to the seal. As shown in FIG. 3, the annular ridge 332 is preferably positioned directly above the upper shield 322. The height and the location of the annular ridge 332 are designed to prevent direct entry of back-scattered atoms travelling in a substantially horizontal direction within the dark space gap 330 into the gap 320. The annular ridge 332 extends at least as far from the outer bottom surface 318a as the height of the gap 320. Preferably, the ridge height 335 of the annular ridge 332, as measured from the outer bottom surface 318a, is about twice the height of the gap 320 between the bottom surface 318 and the upper surface 317 of the insulator ring 316. At this height, the annular ridge 332 effectively prevents most of the back-scattered atoms from entering the gap 320. However, the height of the annular ridge 332 is limited by a minimum distance required between the annular ridge 332 and the upper surface 334 of the upper shield 322 to prevent arcing between the annular ridge 332 and the upper shield 322.

The back-scattered atoms that reach the dark space gap 330 either deposit onto the surfaces of the annular ridge 332 or bounce off of the annular ridge 332 and deposit on the upper shield 322 or on the insulator ring 316. The annular ridge 332 significantly reduces or eliminates deposition of the back-scattered atoms into the gap 320 and on the O-ring 319 and significantly reduces or eliminates particle generation that may result from the deposition on these surfaces.

Figure 4:
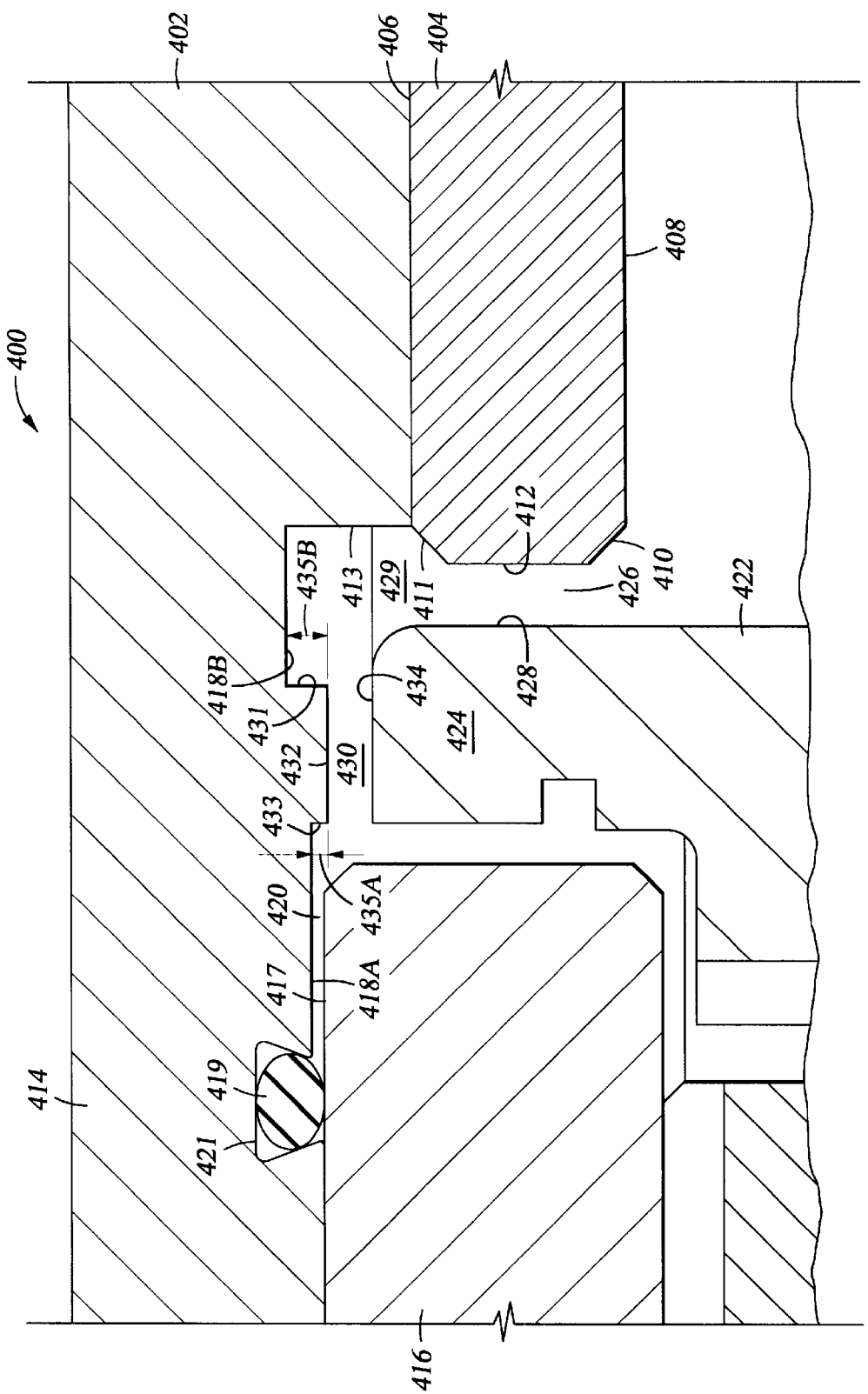
FIG. 4 is a partial cross sectional view of an alternative embodiment of a target 400 according to the invention disposed on a chamber.

FIG. 4 is a partial cross sectional view of an alternative embodiment of a target 400 according to the invention disposed on a chamber. The target 400 is similar in construction and material as the target 300 discussed above except for some variations in shapes. The target 400 includes a backing plate 402 and a sputterable portion 404 extending from an interface 406. The backing plate 402 includes a target support flange portion 414 that rests on or is otherwise secured to an insulator ring 416 disposed on a top portion of the chamber housing. An O-ring 419 disposed in an annular recess 421 provides a seal between the target support flange portion 414 and the insulator ring 416. A gap 420 is formed between an upper surface 417 of the insulator ring 416 and an outer bottom surface 418A of the target support flange portion 414.

The sputterable portion 404 includes a sputterable central surface 408 and a restriction side wall 412. Similarly to the annular curved side wall 312, the side wall 412 and the adjacent vertical inner surface 428 of the upper shield 422 restrict entry of back-scattered atoms into a first dark space gap 429 (defined below). The side wall 412 and the adjacent vertical inner surface 428 also restricts entry of the plasma into the first dark space gap 429. A first tapered edge 410 provides a smooth transition from the sputterable central surface 408 to the side wall 412. A second tapered edge 411 connects the side wall 412 to the interface 406. The backing plate 402 includes an annular recessed side wall 413 that extends from the interface 406 to an inner bottom surface 418B of the target support flange portion 414.

An annular ridge 432 is disposed between the outer bottom surface 418A and the inner bottom surface 418B of the target support flange portion 414. Unlike the annular ridge 332 having a trapezoidal cross section as shown in FIG. 3, the annular ridge 432, as shown in FIG. 4, has a rectangular cross section with substantially vertical ridge walls 431 and 433. Because the outer bottom surface 418A is at a different level than the inner bottom surface 418B, the annular ridge 432 has an outer ridge height 435A defined as the height measured from the outer bottom surface 418A and an inner ridge height 435B defined as the height measured from the inner bottom surface 418B. The outer ridge height 435A is greater than the height of the gap 420 to prevent direct entry of back scattered atoms into the gap 420, and preferably, the outer ridge height 435A is about twice the height of the gap 420.

An upper shield 422 is disposed in an upper portion of the chamber. An upper end 424 of the upper shield 422 extends into the region between the insulator ring 416 and the sputterable portion 404. A re-entry gap 426 is formed between the restriction side wall 412 and a vertical inner surface 428 of the upper shield 422. A first dark space gap 429 is formed between the re-entry gap 426 and the inner bottom surface 418B, including the region adjacent the annular recessed surface 413. A second dark space gap 430 is formed between an upper surface 434 of the upper shield 422 and the target support flange portion 414. As shown in FIG. 4, the second dark space gap 430 is defined as the region above the upper surface 434 and below the annular ridge 432, including portions of the outer and inner bottom surfaces 418A and 418B.

Although the annular ridge 432, the annular recessed side wall 413 and the side wall 412, as shown in FIG. 4, exhibit different cross sectional shapes than the annular ridge 332, the annular recess 313 and side wall 312 of FIG. 3, the same operating principles apply to restrict entry of plasma and back-scattered atoms into the first and second dark space gaps. Other cross sectional shapes can also be used to accomplish the objectives of the present invention.

A primary advantage provided by the present invention is a substantial reduction of particles, in the form of sputtered material, entered through the re-entry gap and deposited within the dark space gaps and the insulator ring. This substantial reduction leads to a substantial reduction in contaminant particle generation, which results in substantially less defect formations on processed substrates. The invention also provides a restriction side wall that restrains entry of plasma through the re-entry gap into the dark space region that may cause sputtering from surfaces in the dark space gap. The invention also significantly reduces deposition onto the surfaces near the annular recess 313 which causes particle generation that may result in cross contamination and defect formations on the substrate. The invention also provides the advantage of prolonged process kit life by preventing deposition onto the O-ring, which leads to less down time for removing and replacing process kits as well as a reduction in cross-contamination due to contaminant particles generated by excess deposits on the O-ring. For example, the invention prevents copper poisoning of aluminum based front end devices by preventing cross-contamination due to contaminant particles generated by excess copper deposits on the O-ring.

While foregoing is directed to the preferred embodiment of the present invention, other and further embodiments of the invention may be devised without departing from the basis scope thereof, and the scope thereof is determined by the claims that follow.

What is claimed is:

1. A target for a physical vapor deposition chamber, comprising:

a) a backing plate having a central portion and a flange portion attachable to the physical vapor deposition chamber;

b) a sputterable portion disposed on the central portion of the backing plate; and c) an annular ridge extending from a surface of the flange portion.

2. The target of claim 1 wherein the sputterable portion comprises an outer edge which defines a restriction side wall.

3. The target of claim 2 wherein the restriction side wall comprises a substantially convex profile that tapers radially inwardly around the sputterable portion.

4. The target of claim 2 wherein the sputterable portion has a flat central sputtering surface and a tapered edge connected to the restriction side wall.

5. The target of claim 2, wherein the sputterable portion has an annular radially recessed portion defined between the flange portion of the backing plate and the restriction sidewall.

6. The target of claim 1, further comprising an O-ring disposed within an annular recess on a surface of the flange portion radially outwardly from the annular ridge.

7. The target of claim 1 wherein the annular ridge has a ridge height greater than a height of a gap formed between a surface of the flange portion and a surface of the physical vapor deposition chamber.

8. The target of claim 7 wherein the ridge height is at least about two times the height of the gap.

9. The target of claim 7, wherein the annular ridge is disposed on the surface of the flange portion between the gap and the sputterable portion.

10. The target of claim 1 wherein the annular ridge comprises at least one sloped side wall.

11. The target of claim 1, wherein the annular ridge extends vertically downward from the surface of the flange portion.

12. The target of claim 1, wherein the annular ridge is integral with the flange portion.

13. The target of claim 1, wherein the annular ridge forms a plasma shield.

14. The target of claim 13, further comprising a first surface disposed between the plasma shield and the central portion and a second surface radially outwardly of the plasma shield.

15. The target of claim 14, wherein the plasma shield is adapted to restrict a material sputtered from the sputterable portion from depositing on the second surface.

16. An apparatus for deposition of a material onto a substrate, comprising:
 a) a physical vapor deposition chamber; and
 b) a target disposed on an upper portion of the chamber, comprising:
  i) a backing plate having a central portion and a flange portion attachable to the physical vapor deposition chamber;
  ii) a sputterable portion disposed on the central portion of the backing plate; and
  iii) an annular ridge extend from a lower surface of the flange portion.

17. The apparatus of claim 16, further comprising an annular shield surrounding the sputterable portion, forming a dark space gap between an upper portion of the shield and the lower surface of the flange portion.

18. The apparatus of claim 17 wherein the annular shield comprises an upper surface positioned below the annular ridge of the target.

19. The apparatus of claim 17 wherein the sputterable portion downwardly extends a vertical distance from the lower surface on the flange portion at least about five times a distance of a gap formed between the annular shield and the sputterable portion.

20. The apparatus of claim 17, wherein the annular ridge is disposed on the lower surface of the flange portion within the dark space gap.

21. The apparatus of claim 17, wherein the annular ridge extends from the lower surface of the flange portion toward the upper portion of the annular shield.

22. The apparatus of claim 16 wherein the annular ridge has a ridge height greater than a height of a gap formed between the lower surface of the flange and a surface of the physical vapor deposition chamber.

23. The apparatus of claim 22 wherein the ridge height is at least about two times the height of the gap.

24. The apparatus of claim 22, wherein the annular ridge is disposed on the lower surface of the flange portion between the gap and the sputterable portion.

25. The apparatus of claim 16 wherein the annular ridge comprises one or more sloped side walls.

26. The apparatus of claim 16, wherein the annular ridge forms a plasma shield.

27. The apparatus of claim 26, further comprising a first surface disposed between the plasma shield and the central portion and a second surface radially outwardly of the plasma shield.

28. The apparatus of claim 27, wherein the plasma shield is adapted to restrict a material sputtered from the sputterable portion from depositing on the second surface.

29. A method for depositing a material onto a substrate, comprising:
 a) providing a physical vapor deposition chamber having a target comprising:
  i) a backing plate having a central portion and a flange portion attachable to the chamber;
  ii) a sputterable portion extending from the central portion of the backing plate; and
  iii) an annular ridge extending from the flange portion;
 b) surrounding the sputterable portion with an annular shield disposed below the annular ridge;
 c) shielding a gap between the flange portion and a surface of the chamber using the annular ridge;
 d) positioning the substrate within the chamber; and
 e) sputtering material from the sputterable portion of the target.

30. The method of claim 29, further comprising maintaining a chamber processing pressure from about 0.2 mTorr to about 1.0 mTorr during sputtering.

31. The method of claim 30, further comprising restricting entry of a plasma into a first dark space gap between the target and the annular shield using an annular restriction side wall extending from the sputterable portion.

32. The method of claim 31 wherein the annular ridge of the target is positioned directly above an upper surface of the annular shield.

33. The method of claim 29, wherein the annular ridge comprises at least one sloped side wall.

34. A target for a physical vapor deposition chamber, comprising:
 a) a backing plate having a central portion and a horizontal flange portion attachable to the physical vapor deposition chamber;
 b) a sputterable portion disposed on the central portion of the backing plate; and
 c) an annular ridge extending from a surface of the horizontal flange portion.

* * * * *

UNITED STATES PATENT AND TRADEMARK OFFICE
CERTIFICATE OF CORRECTION

PATENT NO : 6,149,776

DATED    : November 21, 2000

INVENTOR(S): Tang et al.

It is certified that error appears in the above-identified patent and that said Letters Patent are hereby corrected as shown below:

In column 2, line 2, please replace " comer" with " corner" .

In column 9, line 43, please replace extend" with " extending" .

Signed and Sealed this

Eighth Day of May, 2001

*Attest:*

NICHOLAS P. GODICI

*Attesting Officer*     Acting Director of the United States Patent and Trademark Office